United States Patent [19]
Gertel et al.

[11] Patent Number: 5,164,692
[45] Date of Patent: Nov. 17, 1992

[54] TRIPLET PLATED-THROUGH DOUBLE LAYERED TRANSMISSION LINE

[75] Inventors: Eitan Gertel, Lansdale; Baruch Even-Or, Chalfont, both of Pa.

[73] Assignee: AEL Defense Corp., Lansdale, Pa.

[21] Appl. No.: 755,263

[22] Filed: Sep. 5, 1991

[51] Int. Cl.$^5$ ............................................. H01P 3/08
[52] U.S. Cl. .................... 333/238; 333/246; 333/161; 333/33
[58] Field of Search ............. 333/238, 161, 246, 33, 333/156, 219, 236, 227, 167, 27, 204

[56] References Cited

U.S. PATENT DOCUMENTS

| | | | |
|---|---|---|---|
| 3,895,435 | 7/1975 | Turner et al. | 29/625 |
| 3,974,465 | 8/1976 | White | 333/31 R |
| 4,614,922 | 9/1986 | Bauman et al. | 333/161 |
| 4,641,114 | 2/1987 | Person | 333/161 |
| 4,675,627 | 6/1987 | Johnston | 333/161 |
| 4,940,955 | 7/1990 | Higgins, Jr. | 333/219 X |

*Primary Examiner*—Eugene R. LaRoche
*Assistant Examiner*—ali Neyzari
*Attorney, Agent, or Firm*—Seidel, Gonda, Lavorgna & Monaco

[57] ABSTRACT

A transmission line comprising first and second planar dielectric layers. Each layer has a first surface and a second surface. The first surface of each layer has a plurality of electrical conductors thereon defining a center conductor and at least two other conductors, one on either side of and spaced from the center conductor. The second surface of each layer has an electrically conductive ground plane thereon. The first surface of one layer is opposed to the first surface of the other layer, with the conductors on the first surface of the one layer being in registry with and in physical and electrical contact with the conductors on the first surface of the other layer. A plurality of conductors are provided for making electrical contact with the ground planes and each of the at least two conductors for causing the ground planes and each of the at least two conductors to be at substantially the same electrical potential.

31 Claims, 3 Drawing Sheets

TRIPLET PLATED-THROUGH DOUBLE LAYERED TRANSMISSION LINE

FIELD OF THE INVENTION

This invention relates to TEM mode transmission lines, and in particular to an improved transmission line structure.

BACKGROUND OF THE INVENTION

A transmission line is a system of conductors suitable for conducting electrical power or signals between two or more terminals. For example, commercial-frequency electric power transmission lines connect electric generating plants, substations and their loads. Telephone transmission lines interconnect telephone subscribers and telephone exchanges. Radio-frequency transmission lines transmit high-frequency electrical signals between antennas and transmitters or receivers.

The term "transmission line" is applied to conductors only when both voltage and current at one line terminus may differ appreciably from voltage and current at another terminus.

Depending on the configuration and number of conductors and the electric and magnetic fields about the conductors, transmission lines may be described as open-wire transmission lines, coaxial transmission lines, or strip transmission lines.

Open-wire transmission lines are used mainly for communication and power distribution, and are not germane to the present invention.

A coaxial transmission line 10 is shown in FIG. 2, and comprises a conducting cylindrical shell 12, typically a solid or braided wire conductor, surrounding an electrically-isolated, concentric center conductor 14, which is typically solid but may also be stranded or helically wound on a plastic or ferrite core. The center conductor 14 is typically supported by a solid polyethylene or polystyrene dielectric 16, or, in the case of air- or gas-dielectric transmission lines, the center conductor may be supported by ceramic or plastic beads or washers.

The purpose of coaxial construction is to have the shell prevent radiation losses and interference from external sources. The electric and magnetic fields are nominally confined to the space inside the outer conductor. Coaxial transmission lines are widely used in radio, radar, television, and similar applications.

A strip transmission line consists of a conductor above or below extended conducting surfaces. When the conductor is above a single ground plane, the transmission line is called an unshielded strip transmission line. When the conductor is between two ground planes, the transmission line is called a shielded strip transmission line.

When electric power is applied at a terminus of a transmission line, electromagnetic waves are launched and guided along the line. When the electric and magnetic field vectors are perpendicular to one another and transverse to the direction of the transmission line, this condition is called the principal mode or the transverse electromagnetic (TEM) mode.

Coaxial and strip transmission lines have certain drawbacks associated with them. Coaxial transmission lines are usually employed for short distance runs where the advantage of their flexibility outweigh their relatively high attenuation. Generally, coaxial cable is not used above 3 GHz because of reduced power capability and the small dimensions necessary to avoid higher order propagation modes other than TEM mode. Strip transmission lines are usable at higher frequencies than coaxial transmission lines, but their frequency range depends on the width of the strip and the placement of mode suppression screws to suppress transmission modes other than TEM mode.

It is an object of the present invention to provide a transmission line that avoids the drawbacks of prior transmission lines and allows the efficient construction of a small size, high performance transmission line featuring low RF loss, low dispersion, and high reproducibility. The present invention can be used in EW (electronic warfare) radar, and other systems requiring low dispersion, high phase-accuracy delay lines with wide bandwidth and wide dynamic range.

Other objects, advantages and novel features of the present invention will become apparent from the following detailed description of the invention when considered in conjunction with the accompanying drawings.

SUMMARY OF THE INVENTION

The present invention is a transmission line comprising first and second planar dielectric layers. Each layer has a first surface and a second surface. The first surface of each layer has a plurality of electrical conductors thereon defining a center conductor and at least two other conductors, one on either side of and spaced from the center conductor. The second surface of each layer has an electrically conductive ground plane thereon. The first surface of one layer is opposed to the first surface of the other layer, with the conductors on the first surface of the one layer being in registry with and in physical and electrical contact with the conductors on the first surface of the other layer. A plurality of conductive means are provided for making electrical contact with the ground planes and each of the at least two conductors for causing the ground planes and each of the at least two conductors to be at substantially the same electrical potential.

DESCRIPTION OF THE DRAWINGS

For the purpose of illustrating the invention, there is shown in the drawings a form which is presently preferred; it being understood, however, that this invention is not limited to the precise arrangements and instrumentalities shown.

DESCRIPTION OF THE PREFERRED EMBODIMENT

Figure 1:
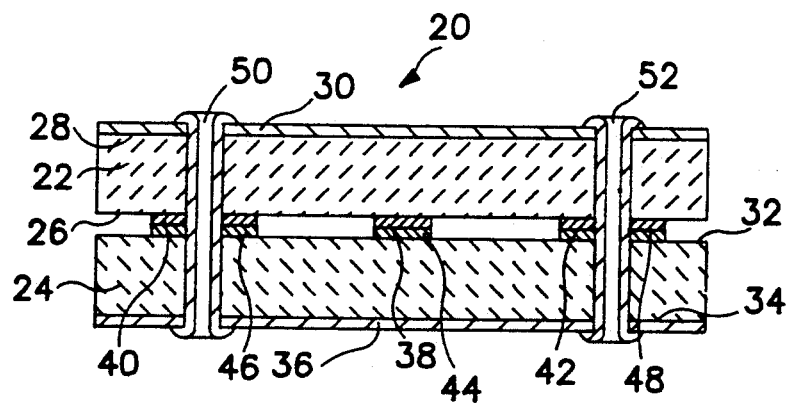
FIG. 1 is an elevational cross-section view of a transmission line in accordance with the present invention.
Figure 2:
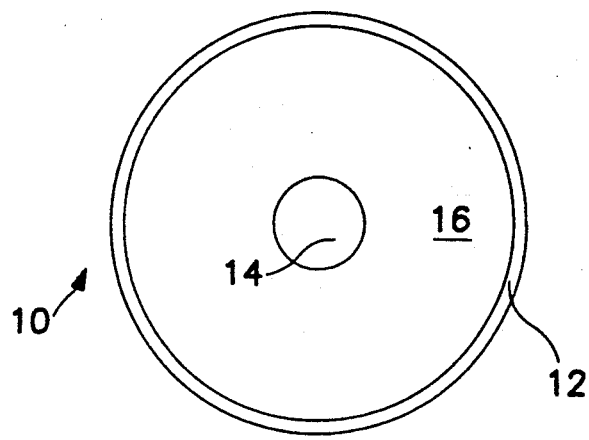
FIG. 2 is a transverse sectional view of a coaxial transmission line according to the prior art.
Figure 3:
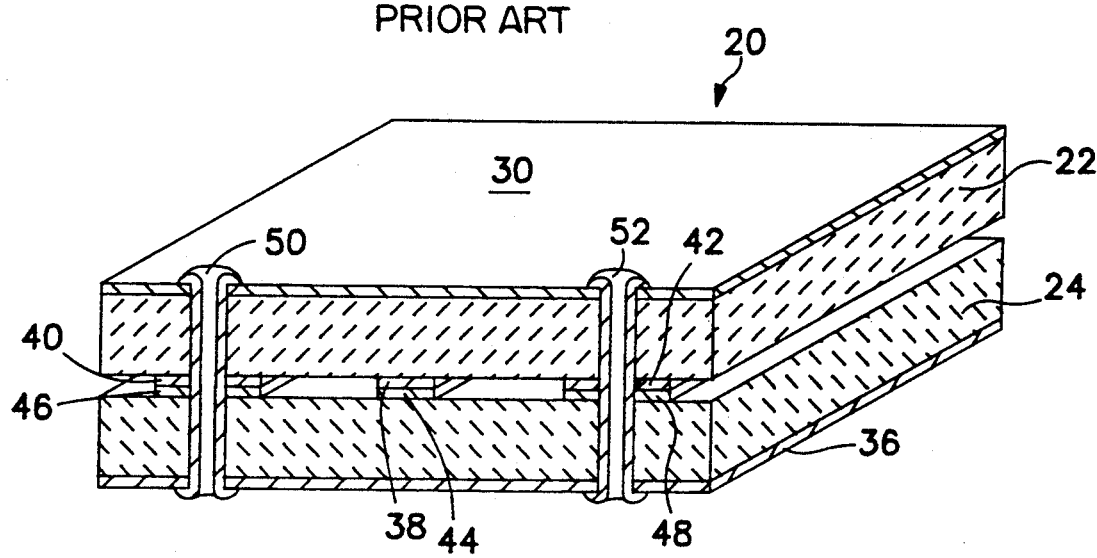
FIG. 3 is an isometric cross-sectional view of the transmission line of FIG. 1.

Referring now to the drawings, wherein like numerals indicate like elements, there is shown in FIG. 1 an elevational view, in section, of a transmission line 20 in accordance with the present invention. An isometric view of transmission line 20 is given in FIG. 3. Transmission line 20 has a "sandwich" style construction and comprises first and second planar dielectric layers 22 and 24, respectively. Dielectric layers 22 and 24 may be made of any suitable dielectric, such as, but not limited to, soft substrate conventional ceramics, superconducting ceramics, alumina or beryllia or similar dielectric ceramic material. The dielectric material is not crucial to the invention, although as those skilled in the art will recognize, the choice of dielectric will determine the characteristic impedance and physical size of the transmission line.

First layer 22 has a first surface 26 and a second surface 28 on which is disposed an electrically-conductive ground plane 30. In similar manner, second layer 24 has a first surface 32 and a second surface 34 on which is disposed an electrically-conductive ground plane 36. Ground planes 30 and 36 may, but need not, be coextensive in surface area with their respective layers 22 and 24. Ground planes 30 and 36 may be formed on layers 22 and 24 by any suitable technique, such as by adhesively joining a conductive sheet to layers 22 and 24, or by a thick- or thin-film deposition technique such as printing, vapor deposition, and so forth. The particular material for the ground planes, and the manner in which they are formed on the layers 22 and 24 is not critical to the invention.

First surface 26 of layer 22 has a plurality of electrical conductors disposed thereon. In the embodiment illustrated, there are three such conductors, designated by reference numerals 38, 40 and 42. As seen in FIG. 1, conductor 38 is located generally in the center of the distance between conductors 40 and 42, and will therefore be referred to as the center conductor. Conductors 40 and 42 are connected to the respective ground planes 30 and 36, as will be described below, and will therefore be referred to as ground conductors. In similar manner, first surface 32 of layer 24 has a center conductor 44 located generally in the center of the distance between two ground conductors 46 and 48. The particular material for the conductors, and the precise manner in which they are formed on the layers, e.g., screen printing, vapor deposition, and so forth, is not crucial to the invention.

As seen in the figures, the first surface of substrate 22 and the first surface of substrate 24 have mirror symmetry. Thus, center conductors 38 and 44 and ground conductors 40, 46 and 42, 48 are in registry when first surface 26 of layer 22 is opposed to first layer 32 of layer 24.

When surfaces 26 and 32 are opposed, the conductors 38, 44, 40, 46 and 42, 48 are brought into physical and electrical contact with each other. The "sandwich" construction of transmission line 20 may be secured by adhesively joining the two halves together. Thus, an adhesive (not shown) may be placed between the conductors on surfaces 26 and/or 32 to secure substrate 22 and 24 together when they are brought into opposing relationship.

Ground planes 30 and 36 and conductors 40, 46 and 42, 48 are all interconnected by a plurality of conductive means in the form of plated through holes, two of which, designated by reference numerals 50 and 52, are illustrated in the figures. As shown in the figures, plated through holes 50 and 52 pass through ground plane 38, first layer 22, conductors 40, 46 and 42, 48, respectively, second layer 24 and ground plane 36. The holes are plated with a conductive material 54, such as but not limited to copper, so that ground planes 30 and 36 are in electrical contact with each other and with ground conductor 40, 46 and 42, 48. The manner in which plated through holes are formed is well known to those skilled in the art and need not be described here in detail. It is sufficient to note that the plated through holes 50 and 52 form a low-resistance electrical path so that the ground planes and the ground conductors are at substantially the same electrical potential.

Preferably, although not necessarily, through holes 50 and 52 are located such that their axes lie on the centerlines of the ground conductors. The diameter of the holes is less than the transverse width of the ground conductors. The spacing of the holes is adjusted such that the spatial separation between them is typically less than half the wavelength of the upper end of the operating frequency range of the transmission line.

The center conductors 38, 44 form the signal or power conductor relative to the ground conductors. Thus, the transmission line is analogous to a coaxial transmission line in that the ground planes, ground conductors and through holes act as the shell of the coaxial line and the center conductors act as the center conductor of the coaxial line.

It will be observed that there is a gap between first and second substrates 22 and 24. This gap is, obviously, equal to the sum of the thicknesses of the conductors disposed on the opposed first surfaces of substrates 22 and 24. This gap will have an effect on the characteristic impedance of the transmission line. Like any other transmission line, the transmission line of the present invention has a characteristic impedance determined by the conductor/dielectric geometry and the dielectric constant of the dielectric material. Since the dielectric constant of air is unity, a larger air gap between the substrates 22 and 24 will increase the characteristic impedance of the transmission line. However, in practice the thickness of the conductors will be very small compared to the thickness of the substrates 22 and 24, and the influence of the air gap on characteristic impedance will not be significant. If desired, an air gap can be avoided entirely by filling the gap, such as with an adhesive as described above, or with some other nonconductive material whose dielectric constant is higher than unity.

It will also be observed by those skilled in the art that the center conductors 38, 44 are not fully shielded as the center conductor in a coaxial cable would be. That is, the ground conductors connected through the plated through holes to the first and second ground planes form an incomplete shield for the center conductors. Proper shielding is important to limit RF signal leakage (i.e., radiation emission) to free space. Such leakage may cause signal attenuation and/or impose frequency-dependent amplitude variation (i.e., amplitude ripple) and/or frequency-dependent phase variation (i.e., phase dispersion). However, in practice this shield configuration is believed to act in the same way as an "ideal" shield from dc up to the upper frequency limit defined by the spacing of the plated through holes.

The present invention offers a number of advantages not available with conventional transmission lines. Among there advantages are ease of manufacture (allowing simple use of CAD/CAM techniques), high precision, small size (when using high-dielectric substrate due to high isolation between turns), very wide bandwidth (typically from dc up to an upper frequency limited only by the spacing of the through holes, low insertion loss, low VSWR, low dispersion and high dynamic range. In addition, a high level of unit to unit phase tracking and amplitude tracking can be obtained, making the transmission line of the present invention ideal for interferometry direction finding systems and other phase-critical RF systems.

Figure 4:
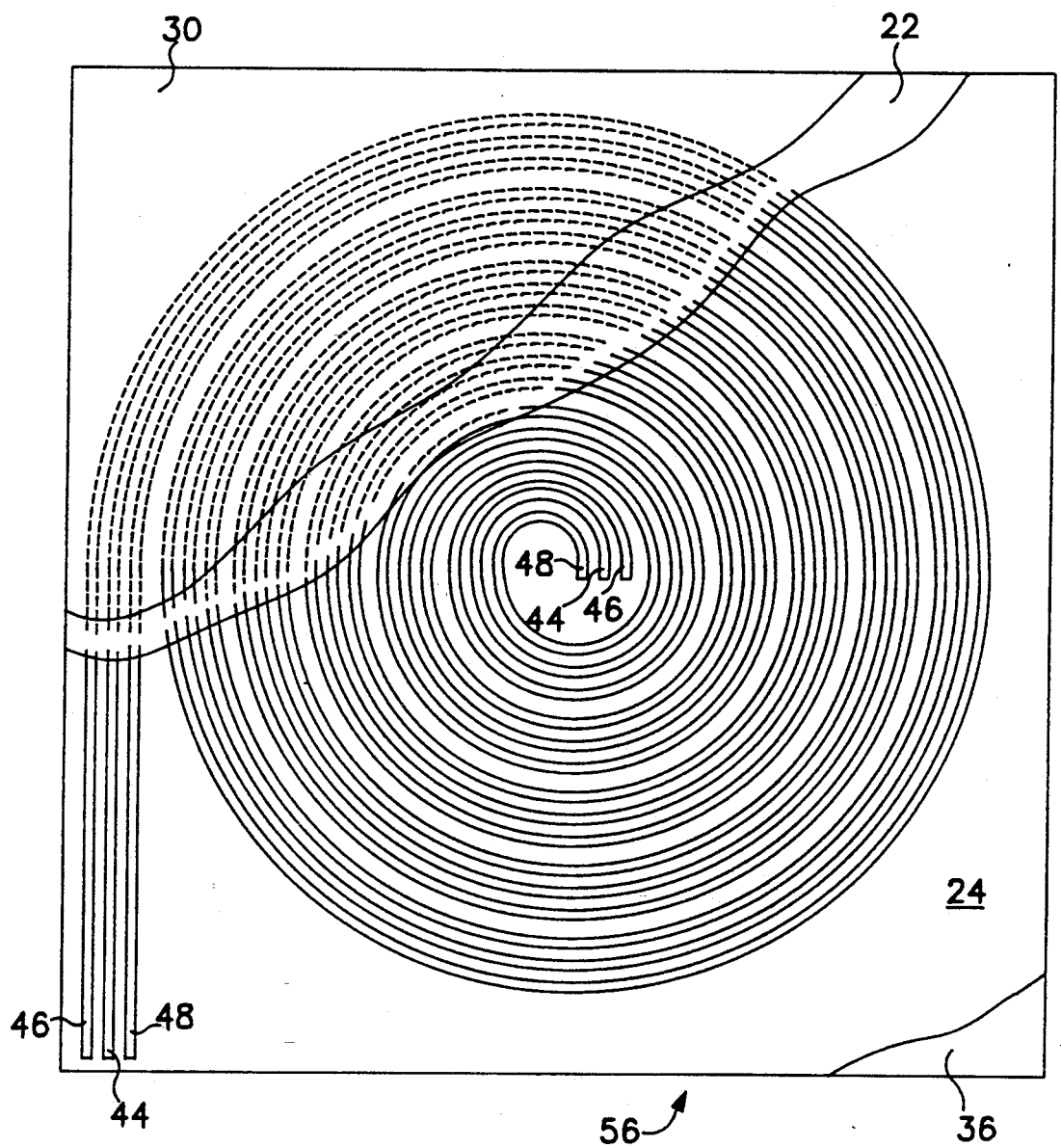
FIG. 4 is a top plan view, partially in section, of a delay line made using a transmission line in accordance with the present invention.

One, but by no means the only, practical application of the transmission line of the invention is a parallel plate delay line 56, illustrated in FIG. 4. FIG. 4 is a partially broken away plan view, wherein the reference numerals refer to the parts already described in conjunction with FIGS. 1 and 3. For clarity, the plated through holes are not shown in FIG. 4, but it should be understood that the delay line illustrated in FIG. 4 will contain a plurality of plated through holes, as already described, through conductors 38, 44, 40, 46, and 42, 48. The center conductors 38, 44 and the ground conductors 40, 46 and 42, 48 are shown forming a spiral configuration. Of course, any other configuration of the conductors, such as diverging, converging, meandering, and the like, is possible, depending upon the particular application to which the transmission line is to be put. The characteristic impedance of the delay line 56 is determined by three independent variables:

(a) the ratio between the width of the center conductor and the width of the spacing between the center conductor and the ground conductors;

(b) the ratio between the width of the center conductor and the distance between the center conductor and the first and second ground planes; and (c) the thickness of the center conductor. By appropriately varying these three parameters, it is possible to obtain a desired characteristic impedance, which enables the designer to obtain desired trade-offs between line delay, line insertion loss, and size.

Figure 5:
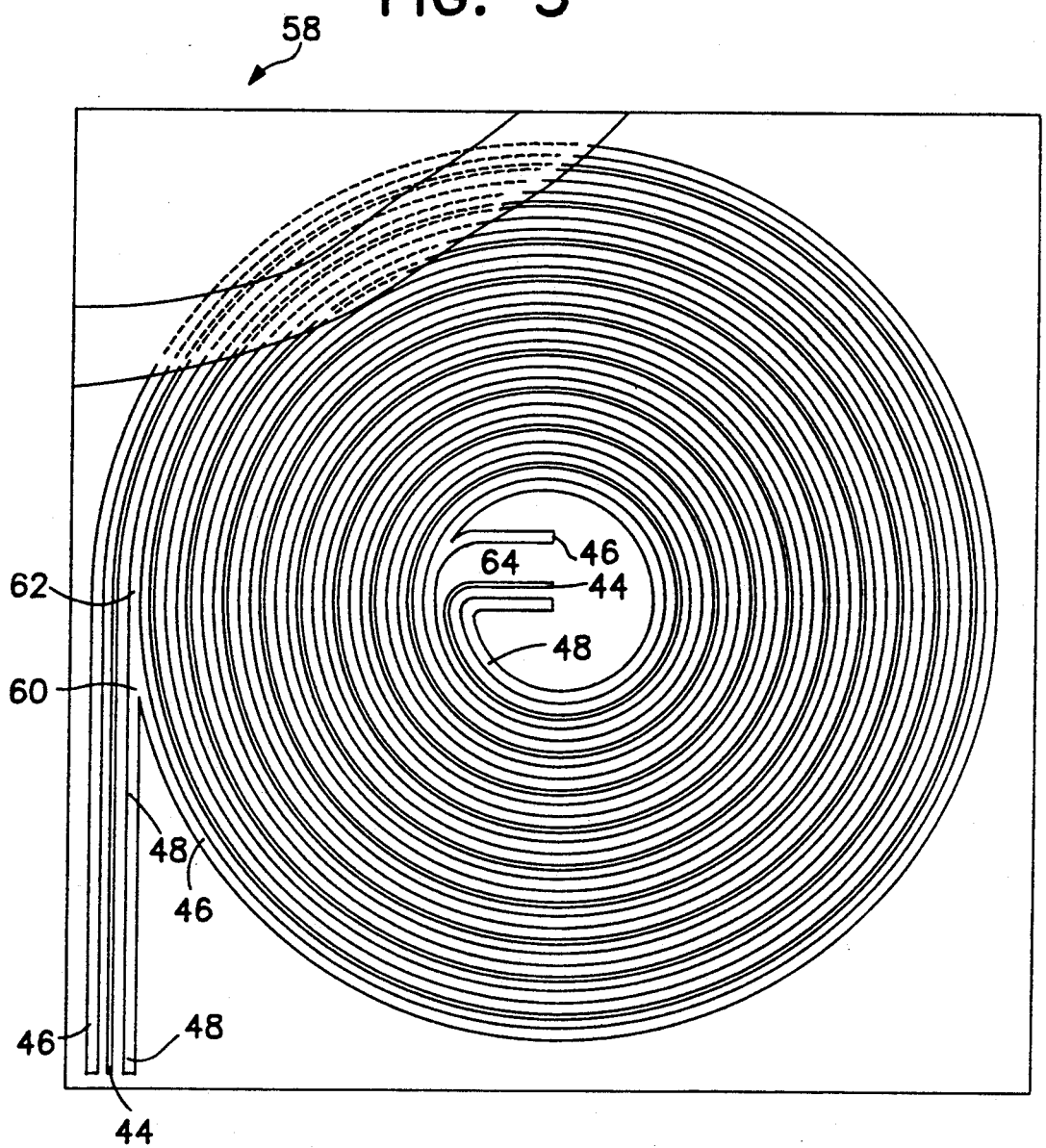
FIG. 5 is a top plan view, similar to FIG. 4, of an alternate embodiment of the invention.

In addition to a delay line as illustrated in FIG. 4, other configurations and applications of the transmission line of the present invention are possible and are limited only by the imagination of the designer. For example, an alternative embodiment of the spiral delay line of FIG. 4 is illustrated in FIG. 5. In FIG. 5, center conductors 38, 44 are the same as shown in FIG. 4. Ground conductors 40, 46 and 42, 48 are somewhat different, however. Instead of being separate and discrete conductors from the outer end of the spiral to the center, ground conductors 40, 46 and 42, 48 merge together at location 60. From location 60 inward toward the center of the spiral, ground conductors 40, 46 and 42, 48 form a single common conductor spaced apart from, and on opposite sides of, center conductors 38, 44. At the center portion of the spiral, ground conductors 40, 46 and 42, 48 separate from the single common conductor at location 64 and again become discrete conductors. By forming a common ground conductor in this manner, it is possible to substantially reduce the number of plated through holes through conductors 40, 46 and 42, 48. This, in turn, simplifies manufacturing operations, decreases cost and increases reliability.

The present invention may be embodied in other specific forms without departing from the spirit or essential attributes thereof and, accordingly, reference should be made to the appended claims, rather than to the foregoing specification, as indicating the scope of the invention.

We claim:

1. A transmission line comprising:
   (a) first and second planar dielectric layers, each having a first surface and a second surface, the first surface of each layer having a plurality of electrical conductors thereon defining a center conductor and at least two conductors, one on either side of and spaced from the center conductor, and the second surface of each layer having an electrically conductive ground plane thereon,
   (b) the first surface of one layer being opposed to the first surface of the other layer, with the conductors on the first surface of the one layer being in registry with and in physical and electrical contact with the conductors on the first surface of the other layer, and
   (c) a plurality of conductive means for making electrical contact with the ground planes and each of the at least two conductors for causing the ground planes and each of the at least two conductors to be at substantially the same electrical potential.

2. A transmission line according to claim 1, wherein said conductive means comprise plated through holes.

3. A transmission line according to claim 2, wherein the diameters of said through holes is less than the transverse dimension of said at least two conductors.

4. A transmission line according to claim 1, wherein the plurality of electrical conductors form an elongated path.

5. A transmission line according to claim 4, wherein the elongated path comprises a spiral.

6. A transmission line according to claim 4, wherein the elongated path is a meander.

7. A transmission line according to claim 4, wherein for at least a portion of the elongated path said at least two conductors on either side of the center conductor are in physical and electrical contact to define a single conductor.

8. A transmission line according to claim 1, wherein the spacing between conductors is non-constant.

9. A transmission line according to claim 1, wherein the conductive means are spaced apart by distances not greater than one-half the wavelength of the highest frequency of signal to be carried by the transmission line.

10. A transmission line comprising:
    (a) first and second planar dielectric layers, each having a first surface and a second surface, the first surface of each layer having a plurality of electrical conductors thereon defining a center conductor and at least two conductors, one on either side of and spaced from the center conductor, and the second surface of each layer having an electrically conductive ground plane thereon,
    (b) the first surface of one layer being opposed to the first surface of the other layer, with the conductors on the first surface of the one layer being in registry with and in physical and electrical contact with the conductors on the first surface of the other layer; and
    (c) a plurality of plated through holes electrically connecting the ground planes and each of the at least two conductors for causing the ground planes and the at least two conductors to be at substantially the same electrical potential.

11. A transmission line according to claim 10, wherein the diameters of said through holes is less than the transverse dimension of said at least two conductors.

12. A transmission line according to claim 10, further comprising an air gap between the first and second layers.

13. A transmission line according to claim 10, further comprising a gap between the first and second layers, said gap being at least partially filled with a dielectric material having a dielectric constant greater than the dielectric constant of air.

14. A transmission line according to claim 13, wherein the dielectric material comprises an adhesive.

15. A transmission line according to claim 10, wherein the plated through holes are spaced apart by distances not greater than one-half the wavelength of the highest frequency of signal to be carried by the transmission line.

16. A transmission line according to claim 10, wherein the plurality of electrical conductors form an elongated path.

17. A transmission line according to claim 16, wherein the elongated path comprises a spiral.

18. A transmission line according to claim 16, wherein the elongated path is a meander.

19. A transmission line according to claim 16, wherein for at least a portion of the elongated path said at least two conductors on either side of the center conductor are in physical and electrical contact to define a single conductor.

20. A transmission line comprising:
(a) first and second planar dielectric layers, each having a first surface and a second surface, the first surface of each layer having a plurality of electrical conductors thereon defining a center conductor and at least two conductors, one on either side of and spaced from the center conductor, and the second surface of each layer having an electrically conductive ground plane thereon, the plurality of electrical conductors being arranged to form a spiral;
(b) the first surface of one layer being opposed to the first surface of the other layer, with the plurality of electrical conductors on the first surface of the one layer being in registry with and in physical and electrical contact with the plurality of electrical conductors on the first surface of the other layer; and
(c) a plurality of plated through holes electrically connecting the ground planes and each of the at least two conductors for causing the ground planes and the at least two conductors to be at substantially the same electrical potential.

21. A transmission line according to claim 20, wherein the plated through holes are spaced apart by distances not greater than one-half the wavelength of the highest frequency of signal to be carried by the transmission line.

22. A transmission line according to claim 20, wherein the plurality of electrical conductors form an elongated path.

23. A transmission line according to claim 22, wherein the elongated path comprises a spiral.

24. A transmission line according to claim 22, wherein the elongated path is a meander.

25. A transmission line according to claim 22, wherein for at least a portion of the elongated path said at least two conductors on either side of the center conductor are in physical and electrical contact to define a single conductor.

26. A transmission line comprising:
(a) first and second planar dielectric layers, each having a first surface and a second surface, the first surface of each layer having three electrical conductors thereon defining a center conductor and two outer conductors, one on either side of and spaced from the center conductor and arranged to form a spiral, and the second surface of each layer having an electrically conductive ground plane thereon,
(b) the first surface of one layer being opposed to the first surface of the other layer, with the conductors on the first surface of the one layer being in registry with and in physical and electrical contact with the conductors on the first surface of the other layer, and
(c) a plurality of plated through holes electrically connecting the ground planes and each of the two outer conductors for causing the ground planes and the two outer conductors to be at substantially the same electrical potential, the diameters of said through holes being less than the transverse dimension of said at least two conductors.

27. A transmission line according to claim 26, wherein the plated through holes are spaced apart by distances not greater than one-half the wavelength of the highest frequency of signal to be carried by the transmission line.

28. A transmission line according to claim 26, wherein the plurality of electrical conductors form an elongated path.

29. A transmission line according to claim 28, wherein the elongated path comprises a spiral.

30. A transmission line according to claim 28, wherein the elongated path is a meander.

31. A transmission line according to claim 28, wherein for at least a portion of the elongated path said at least two conductors on either side of the center conductor are in physical and electrical contact to define a single conductor.

* * * * *